United States Patent [19]

Keller

[11] 3,996,096
[45] Dec. 7, 1976

[54] METHOD FOR CRUCIBLE-FREE ZONE MELTING OF SEMICONDUCTOR CRYSTAL RODS

[75] Inventor: Wolfgang Keller, Munich, Germany

[73] Assignee: Siemens Aktiengesellschaft, Berlin & Munich, Germany

[22] Filed: Dec. 8, 1975

[21] Appl. No.: 638,261

Related U.S. Application Data

[62] Division of Ser. No. 525,641, Nov. 20, 1974, Pat. No. 3,923,468.

[30] Foreign Application Priority Data

Nov. 22, 1973  Germany .......................... 2358300

[52] U.S. Cl. .............................. 156/620; 23/273 R
[51] Int. Cl.² .......................................... B01J 17/10
[58] Field of Search ................... 23/273 SP, 273 Z; 156/620, 617 SP; 13/13 ZM

[56] References Cited

UNITED STATES PATENTS

| | | | |
|---|---|---|---|
| 3,159,408 | 12/1964 | Sanchez | 156/620 |
| 3,179,593 | 4/1965 | Reuschel | 156/620 |
| 3,498,846 | 3/1970 | Keller | 156/620 |
| 3,781,209 | 12/1973 | Reuschel | 156/620 |

FOREIGN PATENTS OR APPLICATIONS

| | | | |
|---|---|---|---|
| 1,519,901 | 2/1970 | Germany | 156/620 |
| 848,382 | 9/1960 | United Kingdom | 156/620 |

OTHER PUBLICATIONS

Lehovec, The Review of Scientific Instru, vol. 24, No. 8, Aug. 1953, pp. 652 to 655.

*Primary Examiner*—Stephen J. Emery
*Attorney, Agent, or Firm*—Hill, Gross, Simpson, Van Santen, Steadman, Chiara & Simpson

[57] ABSTRACT

Polycrystalline semiconductor rods are converted to dislocation-free monocrystal rods by positioning a polycrystalline rod within a crucible-free zone melt environment with a seed crystal attached to one end thereof, generating a melt zone at the juncture of the seed crystal and the polycrystalline rod, controllably moving the melt zone away from the juncture and through the polycrystalline rod to a select point thereon, uniformly supporting the cone-shaped lower portion of the rod being processed so as to prevent oscillations and the like at the juncture of the rod in the seed crystal and controllably moving the melt zone from the select point to the remainder of the rod. A uniform support is preferably provided by an axially movable funnel-shaped casing which is attached to the seed crystal holding member and which, when moved into its operating position, is filled with a self-adjusting oscillation or vibration dampening means, such as molten metal, metal spheroids, quartz particles, sand, etc.

2 Claims, 3 Drawing Figures

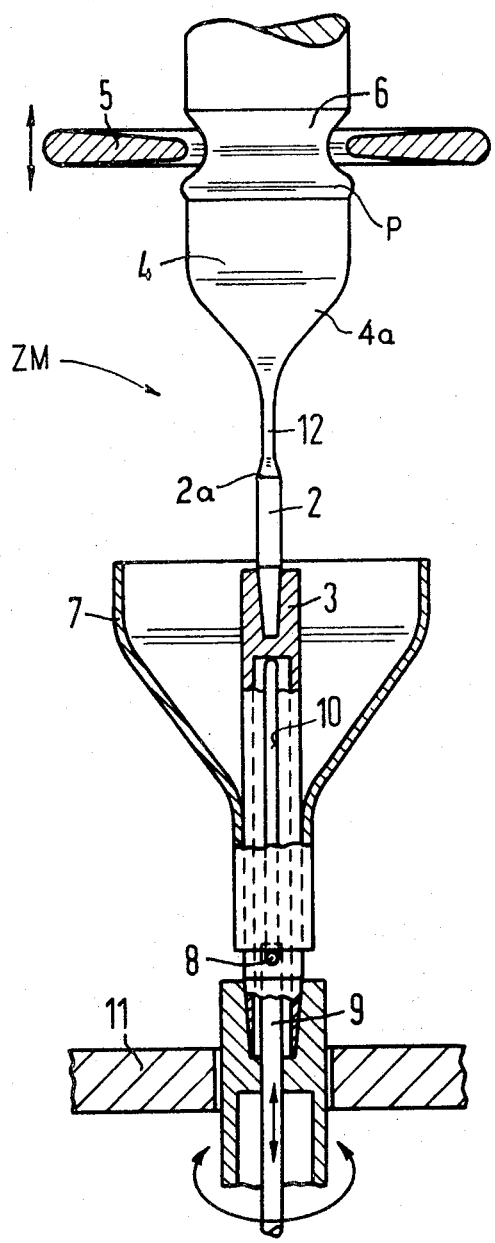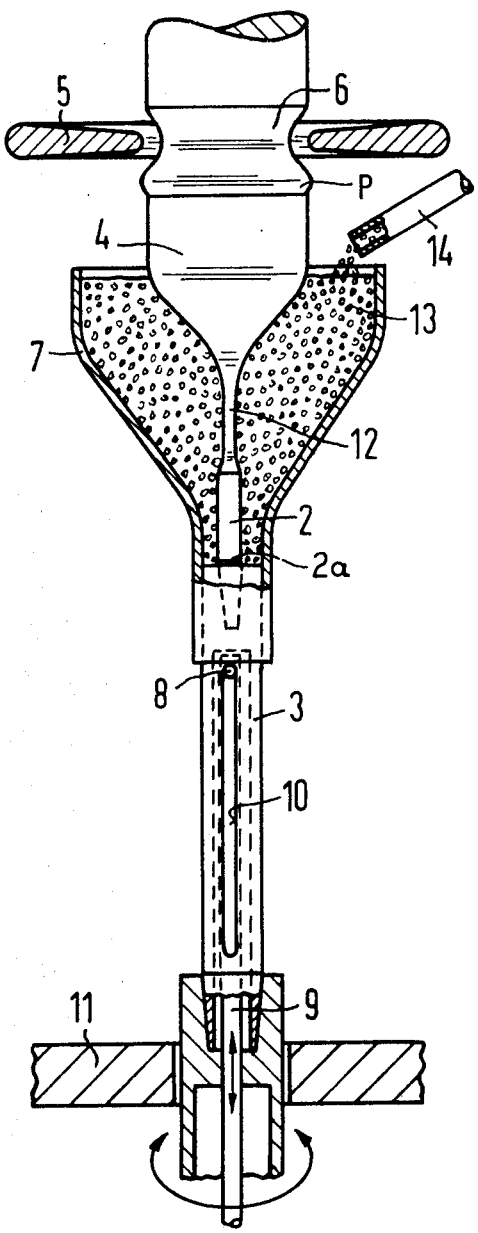

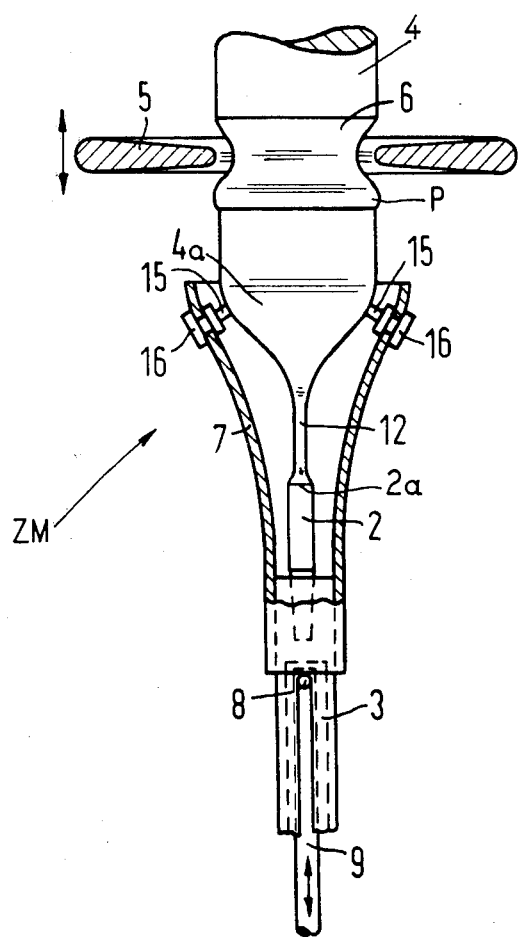

METHOD FOR CRUCIBLE-FREE ZONE MELTING OF SEMICONDUCTOR CRYSTAL RODS

This is a division of application Ser. No. 525,641, filed Nov. 20, 1974, now U.S. Pat. No. 3,923,468.

BACKGROUND OF THE INVENTION

1. Field of the Invention

The invention relates to processing semiconductor crystal rods and somewhat more particularly to a method and apparatus for crucible-free zone melt processing of a semiconductor crystal rod whereby formation of dislocations and irregularities within the process crystal are avoided.

2. Prior Art

Semiconductor crystals, particularly those composed of silicon, are generally produced by a crucible-free zone melt process whereby a monocrystalline seed or nucleation crystal having a relatively small diameter is melt-connected, as with the aid of an induction heating coil, to an end of a relatively large diameter polycrystalline semiconductor member and a melt zone is generated at the junction of the seed crystal and the polycrystalline member and passed one or more times along the length of the polycrystalline member. The melt zone is moved by providing relative movement between the polycrystalline member and a heat source, such as an induction heating coil, which may be the same one used to melt-connect the seed crystal with the polycrystalline member or be different therefrom. In this manner, a polycrystalline member is purified of any foreign constituencies and simultaneously converted into a monocrystalline member.

In the production of semiconductor components from so-produced semiconductor materials, it is desirable that the semiconductor material be as free as possible from dislocations and other irregularities which materiall interfere with the electrical properties of the semiconductor components produced therefrom. Further, the presence of dislocations, etc. within the semiconductor material decreases the life of minority carriers within such semiconductor materials.

German Auslegeschrift No. 1,079,593 (which generally corresponds to British Patent No. 889,160) suggests that dislocations in rod-shaped semiconductor members may be decreased at the melt-connected juncture of the seed crystal and such semiconductor members by decreasing the cross-section of the semiconductor member at the direct proximity of such melt-connected juncture prior to the last pass of the melt zone through the semiconductor member. Dislocations which may be present in the seed crystal are thus given a chance to heal in the thus-produced thin connecting piece or bridge between the seed crystal and the semiconductor member.

German Patent No. 1,128,413 (which generally corresponds to U.S. Pat. No. 3,175,891) discloses that substantially dislocation-free rod-shaped silicon monocrystals may be produced, for example, by controlling the rate or speed of travel of one or more passages of a crucible-free zone melt through the rod. This reference suggests that all passages of the melt zone start in the seed crystal and that the travel speed of the melt zone in the seed crystal should be controlled so as to be in the range of about 7 to 15 mm/min. During the last pass of the melt zone, the silicon rod cross-section at the juncture of the seed crystal and the silicon rod is constricted by a temporary relative movement of the rod ends at a speed greater than 25 mm/min. while the speed of the melt zone is steadily decreased from this constriction point until the full cross-section of the rod is attained. Thereafter, the melt zone is moved through the rod at a speed less than about 7 mm/min.

It has been noted that when monocrystalline semiconductor rods of a fairly large diameter are being produced by the crucible-free zone melt process, the rod-shaped monocrystals which grow at the seed crystal at the last passage of the melt zone tend to oscillate, particularly at the thin-connecting or bridging piece between the monocrystal and the seed crystal. This drawback is particularly acute when thick monocrystalline semiconductor rods are being produced, for example, by way of shortening or compacting during a crucible-free zone melt process. These oscillations appear to cause the development of dislocations and other irregularities in monocrystals of the material as it becomes rigid during the last passage of the melt zone through the semiconductor rod. In addition, such oscillations often cause a dripping of molten material from the melt zone or even a breakage of the thin-connecting or bridging piece between the seed crystal and the semiconductor rod, which, of course, causes an interruption in the melt zone process.

I have disclosed in German Offenlegungsschrift No. 1,519,901 a means of supporting the ends of a crystal rod at the juncture thereof with a seed crystal which comprises a finger-like support means that is positioned on the upper edge of a casing and which is axially movable and encloses the mounting for the seed crystal. However, this arrangement does not completely obviate vibrations or oscillations during the growth of very thick (i.e. having a diameter larger than 30 mm) dislocation-free semiconductor monocrystalline rods since the finger-like supports do not uniformly touch the overall round cone portion of such rod. Due to this instability, increased oscillations may be produced opposing the supporting effect desired or may even eliminate any beneficial supporting action.

SUMMARY OF THE INVENTION

The invention provides an improved zone-melt process and apparatus therefor which substantially eliminates or prevents the development of oscillations at the juncture of a seed crystal and a semiconductor rod during the passage of, for example, a last pass of the melt zone through the semiconductor rod.

In accordance with the principles of the invention, a movable funnel-shaped support means is coupled with a mounting for a seed crystal so that upon activation of the support casing, it moves to an upper or support position and completely and uniformly encases the cone area of the rod. The support means may include a funnel-shaped casing movable to the support position and a means for filling the casing with a vibration or oscillation dampening means which provides a uniform contact with the cone area of the rod whereby all points about the cone area circumference are completely supported by such dampening means. In certain embodiments of the invention, such dampening means may comprise granular silicon, granular quartz or sand. In other embodiments of the invention, such dampening means may comprise a liquified metal, preferably molten lead or indium, which becomes rigid within the funnel-shaped casing to provide a desired support. In other embodiments of the invention, the vibration or oscillation dampening means may comprise metal spheroids or the like in an extremely dense distribution. In yet other embodiments of the invention, the dampening means may comprise inserts of an extremely pure metal, for example, aluminum, attached to the upper periphery of the funnel-shaped casing which contact the cone area of the rod upon upward movement of the casing and melt with the rod material to form an eutectic mixture between the metal and the rod material, for example, silicon, which then solidifies and provides a solid connection between the casing and the rod. These last embodiments, as compared to the suggestions of German Offenlegungsschrift No. 1,519,901, provide a uniform dampening and supporting function even at any and all non-uniform points along the cone area circumference during the alloying process.

BRIEF DESCRIPTION OF THE DRAWINGS

FIG. 1 is a partial cross-sectional elevated view of a lower rod mounting arrangement for use in a crucible-free zone melt process which schematically illustrates an embodiment of the invention in a non-operative position;

FIG. 2 is a somewhat similar view to that of FIG. 1 and schematically illustrates an embodiment of the invention in an operative position; and FIG. 3 is a partial cross-sectional elevated view of a lower rod mounting arrangement for use in a crucible-free zone melt process, which schematically illustrates another embodiment of the invention in an operative position.

DESCRIPTION OF THE PREFERRED EMBODIMENTS

The invention provides an improved method and apparatus for producing dislocation-free monocrystalline semiconductor rods.

In accordance with the principles of the method embodiments of the invention, a polycrystalline semiconductor rod, such as primarily composed of silicon, is melt-connected to a seed crystal and positioned within a crucible-free zone melt environment. A melt zone is generated at the juncture between the rod and the seed crystal and controllably moved through the rod to a select point thereon, preferably at least about 10 cm above the cone-shaped area of the rod and then the cone-shaped lower area of the rod is uniformly supported so as to prevent any ocsillations and the like from forming at the juncture of the rod in the seed crystal. Thereafter, the melt zone is again controllably moved through the remainder of the rod. In this manner, oscillations at the juncture between the semiconductor rod and the seed crystal are avoided so that dislocations and other irregularities cannot develop within the processed rod.

In accordance with the principles of the apparatus embodiments of the invention, a funnel-shaped casing is appropriately coupled to a seed crystal mounting means so as to be axially and rotatably movable with said mounting means and axially movable relative to such mounting means. At its uppermost position, the casing uniformly encloses the conical area of the crystalline rod being processed. Self-adjusting vibration dampening means, such as molten metal, particulated quartz, sand, silicon, etc. is preferably provided within the casing to positively provide anti-oscillation support and uniformly contact any irregular points about the rod circumference.

An extremely economical and reliable oscillation or vibration arresting action is obtained by the addition of a dampening means, such as grain-like silicon, quartz, sand and/or metal particles. Such dampening means, which may also include liquified or molten metal, is essentially self-adjusting to any irregularities in the rod circumference and provides a uniform and complete support for the enclosed area thereof and prevents oscillations or the like so that dislocation-free crystals are readily and reliably produced by following the principles of the invention.

In one preferred embodiment of the invention, the dampening means comprises rigid inserts composed of a very pure metal having a relatively low melting point, such as aluminum, which are positioned at the upper periphery of the funnel-shaped casing so that upon the upward movement of the casing, the inserts contact adjacent points of the rod and the ends of the inserts melt to form a eutectic mixture with the rod material and then solidify to provide positive anti-oscillation support. In comparison with the arrangement suggested by German Offenlegungsschrift No. 1,519,901, the instant invention, including the above preferred embodiments thereof, provides a uniform support for any and all uneven points or the like at the rod circumference thereby avoiding the drawbacks noted earlier and providing positive and complete support for the growing monocrystalline rods.

In accordance with the principles of the invention, the uniform support for the bottom of the rod being processed is provided when the melt zone has traveled through the rod to a select point thereon, preferably at least about 10 cm above the highest reach of the funnel-shaped support means.

A preferred embodiment of an apparatus constructed and operable in accordance with the principles of the invention comprises two vertically opposing and approximately coaxially aligned rod mounting members in a crucible-free zone melt apparatus which may typically include an induction heating coil and an enclosed chamber along with means for supplying energy to the coil and for supplying a select atmosphere to the chamber. At least one of the rod mounting members is provided with a seed crystal which is melt-connected to a rod to be treated (i.e. a melt zone is generated at adjacent surfaces of the seed crystal and the rod and the molten surfaces are brought together to form a unified molten mass which is allowed to solidify and form a solid juncture. The rod mounting member having the seed crystal therein is also coupled with a funnel-shaped hollow casing which is axially and rotatably movable with the mounting member and is independently axially movable relative to the mounting member. This funnel-shaped casing is axially movable a distance sufficient to encompass the cone area of a rod above a seed crystal and may be associated with a means for providing a self-adjusting vibration or oscillation dampening means to the casing. The self-adjusting oscillation dampening means is selected from the group consisting of particulate silicone, quartz, sand, metal (metal spheroids), liquified and re-solidifiable metal having a relatively low melting point, i.e. below the melting point of the rod being treated, such as aluminum, lead or indium, which may be provided in initially molten form to simply fill any space between the hollow funnel-shaped casing or be provided as solid inserts, the ends of which melt upon contact with the hot cone area of the rod being processed so as to form a eutectic mixture and upon solidification form a solid support for the rod. The flowable dampening means may be added to the funnel-shaped casing with the aid of an appropriate filling device, such as a conduit and the non-flowable dampening means may be added to the funnel-shaped casing during assembly thereof.

In the drawings, only essential features of the crucible-free zone melt apparatus have been illustrated in order to simplify the understanding of the invention and workers in the art will readily recognize and supply other elements and/or features required to obtain an operable zone melt apparatus and such operable apparatus will hereinafter and in the claims be referred to as a crucible-free zone melt apparatus and/or environment.

As shown at FIG. 1, a monocrystalline seed 2 is mounted in a mounting member 3 within a crucible-free zone melt apparatus and/or environment ZM. The seed crystal 2 is melt-connected with the lower end of a semiconductor crystalline rod 4 so as to form a juncture 2a therebetween. The rod 4 and the seed crystal 2 may, for example, be composed of silicon. A melt zone 6 is generated, as with the aid of induction heating coil 5, and controllably moved in an axial direction through the rod 4 from the juncture 2a upward to a select point P thereon. Movement of the melt zone is achieved by relative movement between the rod 4 and the heat coil 5.

A hollow funnel-shaped casing 7, for example, composed of titanium, steel, silicon or graphite, is mounted to encase the mounting member 3 and since the drive means (schematically illustrated as the vertically double-headed arrow and the horizontally curved double-headed arrow) for the mounting member is outside the bottom wall 11 of the crucible-free zone melt apparatus ZM, the casing 7 is axially and rotatably movable with the mounting member 3. In addition, casing 7 is independently axially movable relative to the mounting member 3. Thus, when the mounting member 3 is axially or rotatably moved, the casing 7 is likewise moved but the casing 7 may be axially moved independent of the mounting member 3. The funnel casing 7 is supported on a stud 8 which is attached to a pin 9 arranged within the mounting member 3 and which is axially movable. The stud 8 may be positioned within a guide slot 10 within the mounting member 3. Workers in the art will readily appreciate that other coupling means may also be utilized in accordance with the principles of the invention. Reference numeral 11 designates a portion of the bottom wall of an enclosed chamber typically utilized in a crucible-free zone melt apparatus and various seal means, drive means, atmosphere control means, energy supply means, etc. have been omitted from the drawings in order to simplify the understanding of the invention and to provide a better overall view of the essential features of the invention.

FIG. 1 illustrates the relative position of the elements before the rod end 4a is provided with support. The end 4a at this stage has grown as a monocrystal without dislocations at the relatively thin connecting or bridging piece 12 during a so-called bottle-neck-shaped constriction or necking process whereby a melt connection was formed between the seed crystal and the rod 4 and the melt zone moved therefrom through the rod one or more times. Since during such a process, both the rod 4 and the seed crystal 2 are rotated about their respective axes, there is a danger that the end 4a of the rod 4 which grows at the bottle-neck-shaped constriction 12 may begin to oscillate or vibrate when the melt zone 6 moves sufficiently from the juncture 2a between the seed crystal 2 and the rod 4.

In instances where a silicon rod of about 40 mm diameter is being so processed, the distance between the bridging piece 12 and the melt zone at which such oscillations are noted is about 70 cm. The amplitudes of such oscillations are often so great that the growth process must be interrupted and corrective measures taken.

In accordance with the principles of the invention, before the melt zone 6 reaches the critical distance or point from the bottle-neck-shaped constriction 12, the funnel-shaped casing 7 is moved upwardly with the aid of the pin 9 so as to encase the cone area 4a of the rod 4 positioned above the seed crystal 2, such as shown in FIGS. 2 and 3. In order to insure a positive support and oscillation arrest, a self-adjusting dampening or stabilizing means 13 is provided between the interior of the funnel-shaped casing 7 and the periphery of the lower end 4a of the rod 4.

FIG. 2 illustrates a funnel-shaped casing 7 being filled with the dampening means 13, such as particulate quartz or sand, via a filling conduit 14. Granular silicon, metal spheroids, sand or a compatible (i.e. substantially inert and non-contaminating) metal, such as molten lead or indium, which solidifies within the casing 7 upon coming in contact with the relatively hot lower rod portion may also be used in place of the particulate quartz or sand. As is apparent from FIG. 2, once the casing 7 has been moved to its operative or supporting position, the rod 4 can no longer oscillate on the bottle-neck-shaped constriction. The lower rod portion 4a follows the seed crystal and the narrow constriction or bridging piece 12 is already sufficiently cold at this time so that no dislocations or the like can form. The remaining reference numerals shown in FIG. 2 are identical to those utilized in FIG. 1 and refer to identical elements discussed in conjunction with FIG. 1.

FIG. 3 illustrates another embodiment of the invention for supporting a growing monocrystal so as to avoid formation of dislocations or other irregularities therein. In this embodiment, inserts 15 are attached via mountings 16 along the upper periphery of a funnel-shaped casing 7 so that such inserts gently touch the periphery of the cone area 4a when the casing is moved to its upward position. The inserts 15 are composed of a compatible, relatively low melting, extremely pure metal, for example, aluminum, which melts upon contact with the still-hot rod material and alloys with or forms a eutectic mixture therewith. While the melt zone continues its passage upwardly through the remaining portions of the rod 4, the alloyed area of the rod cone circumference cools and a solid connection forms which prevents any oscillations or vibrations and provides a uniform support for any and all uneven points on the cone circumference. In this embodiment, it is important to select a metal for the inserts which has an appropriate melting point. The remaining reference mumerals in this Figure are identical with those utilized in FIGS. 1 and 2 and refer to similar elements as discussed in conjunction with FIGS. 1 and 2.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appendant claims.

I claim as my invention:

1. A method of crucible-free zone melt processing of a semiconductor crystal rod comprising:

arranging a semiconductor crystal rod within a crucible-free zone melt environment with a seed crystal attached to a lower end thereof;

generating a melt zone at the juncture of said seed crystal and said rod and controllably moving said melt zone away from said juncture through said rod to a select point thereon;

uniformly supporting said lower end of said rod by axially upwardly moving a hollow funnel-shaped casing from a position below said juncture between the seed crystal and the rod to a position surrounding the lower end of said rod, said casing having relatively low melting pure metal inserts attached at the upper periphery of said funnel-shaped casing, said inserts melting upon contact with the still-hot lower end of the rod as such rod is traversed by said melt zone so as to form a eutectic mixture with the material of said rod and then solidifying to form a solid connection between said casing and the lower end of said rod; and controllably moving said melt zone from said select point through the remaining portion of said rod.

2. A method as defined in claim 1 wherein said inserts are composed of aluminum.

* * * * *